United States Patent [19]

Stokes et al.

[11] Patent Number: 5,717,702
[45] Date of Patent: Feb. 10, 1998

[54] SCAN TESTING DIGITAL LOGIC WITH DIFFERING FREQUENCIES OF SYSTEM CLOCK AND TEST CLOCK

[75] Inventors: Robert L. Stokes, Redondo Beach; William D. Farwell, Thousand Oaks, both of Calif.

[73] Assignee: Hughes Electronics, Los Angeles, Calif.

[21] Appl. No.: 751,379

[22] Filed: Nov. 19, 1996

Related U.S. Application Data

[63] Continuation of Ser. No. 403,607, Mar. 14, 1995, abandoned.

[51] Int. Cl.$^6$ .......................... G01R 31/28; G06F 11/267
[52] U.S. Cl. ............................ 371/22.35; 371/22.32
[58] Field of Search .................. 371/22.31, 22.36, 371/22.32, 22.35, 22.33, 22.34; 395/183.06

[56] References Cited

U.S. PATENT DOCUMENTS

| | | | |
|---|---|---|---|
| 4,764,926 | 8/1988 | Knight et al. | 371/22.5 |
| 5,003,204 | 3/1991 | Cushing et al. | 326/40 |
| 5,043,986 | 8/1991 | Agrawal et al. | 371/25.1 |
| 5,048,021 | 9/1991 | Jarwalo et al. | 371/22.3 |
| 5,132,974 | 7/1992 | Rosales | 371/22.3 |
| 5,337,321 | 8/1994 | Ozaki | 371/22.3 |
| 5,504,756 | 4/1996 | Kime et al. | 371/22.3 |
| 5,524,114 | 6/1996 | Peng | 371/22.1 |

*Primary Examiner*—Robert W. Beausoliel, Jr.
*Assistant Examiner*—Phillip F. Vales
*Attorney, Agent, or Firm*—Leonard A. Alkov; Wanda K. Denson-Low

[57] ABSTRACT

A boundary scan test circuit that includes Y scan flip-flops serially connected in a sequence from a first scan flip-flop to a $Y^{th}$ scan flip-flop and clocked with a system clock signal, and circuitry for providing scan input data to the first scan flip-flop synchronously with a test clock signal and for receiving scan output data from the $Y^{th}$ scan flip-flop synchronously with the test clock signal, wherein the test clock signal and the system clock signal have a test clock period to system clock period ratio that is equal to any fixed integer ratio M.

1 Claim, 3 Drawing Sheets

SCAN TESTING DIGITAL LOGIC WITH DIFFERING FREQUENCIES OF SYSTEM CLOCK AND TEST CLOCK

This is a continuation application Ser. No. 08/403,607, filed Mar. 14, 1995, now abandoned.

BACKGROUND OF THE INVENTION

The subject invention is directed generally to scan path testing circuitry, and more particularly to scan path test circuitry for applications wherein the test clock frequency differs from the system clock frequency of the device under test.

Digital integrated circuit devices often employ special circuits to aid testability so as to make the operation of testing a digital device simpler, more efficient and more effective.

A very common built-in test circuit is a scan path or chain by which the bistable elements (flip-flops and/or latches) within a digital device are connected into a shift register called a scan path or scan chain. With the digital device in scan mode, an input pattern is serially scanned into the bistable elements (i.e., serially shifted into the bistable elements). The digital device is then operated in the normal mode for one clock period, which causes the bistable element contents to act as inputs to the internal combinatorial logic, and causes subsequent response values to be stored in the bistable elements. The digital device is again placed in the scan mode to allow the response pattern stored in the bistable elements to be serially scanned out (i.e., serially shifted out) and compared with the correct response.

In the scan mode, input patterns are provided by external test equipment which also receives the response patterns shifted out of the storage elements of a scan path. Typically, the input patterns and response patterns are communicated over a common serial test bus, as for example specified by the IEEE Standard 1149.1 for a Standard Test Access Port. Often the serial scanning of the response pattern from a device under test must be performed at a test clock frequency that is lower than the system clock frequency at which the device under test performs its operational functions.

Known techniques for accommodating a different test clock frequency have included switching from the system clock to the test clock during test operations, and gating the system clock to match the test clock, wherein gating is achieved by selectively disabling and enabling the individual scan flip-flops. These known techniques, however, have disadvantages of either degraded performance of the clock distribution system of the device being tested, or increased the gate count, which increases complexity and cost.

SUMMARY OF THE INVENTION

It would therefore be an advantage to provide an efficient and economical scan path test circuit that accommodates a test clock frequency that is different from a system clock frequency without disturbing the clock distribution system of the digital device in which it is implemented.

The foregoing and other advantages are provided by the invention in a boundary scan test circuit that includes Y scan flip-flops serially connected in a sequence from a first scan flip-flop to a $Y^{th}$ scan flip-flop and clocked with a system clock signal, and circuitry for providing scan input data to the first scan flip-flop synchronously with a test clock signal and for receiving scan output data from the $Y^{th}$ scan flip-flop synchronously with the test clock signal, wherein the test clock signal and the system clock signal have a test clock period to system clock period ratio that is equal to a fixed integer ratio M.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
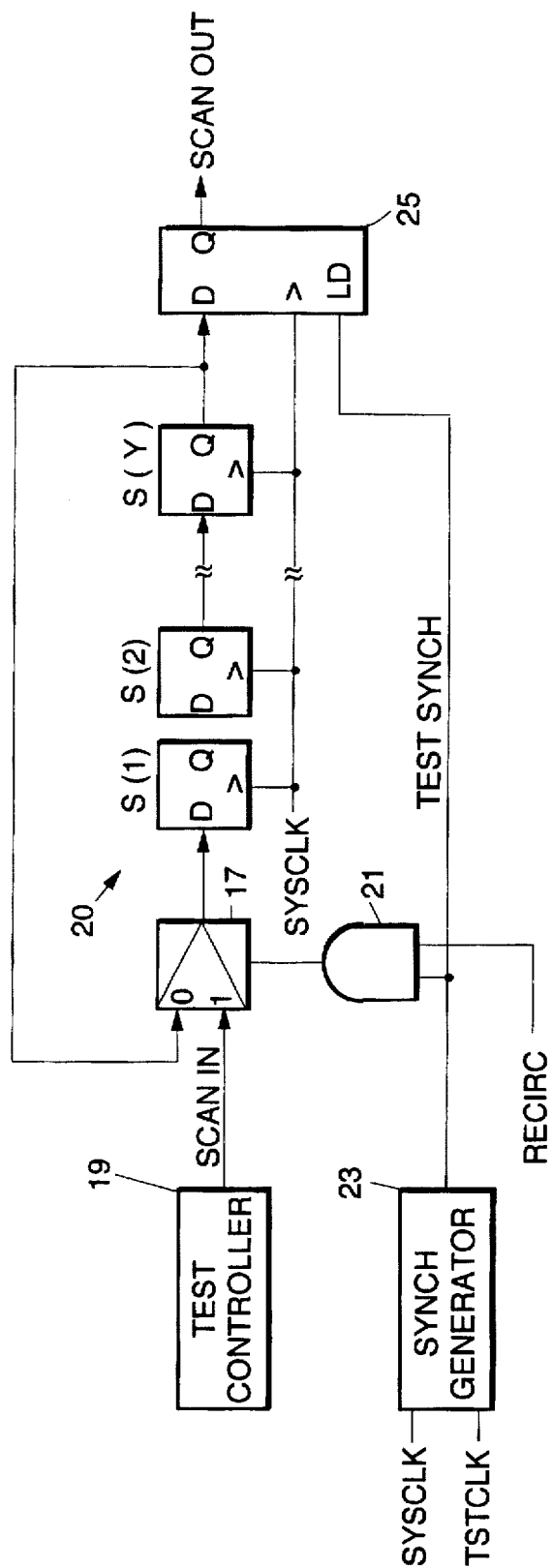
FIG. 1 is a schematic block diagram of an embodiment of a test circuit in accordance with the invention.

In the following detailed description and in the several figures of the drawing, like elements are identified with like reference numerals.

Referring now to FIG. 1, set forth therein is a schematic block diagram of a scan path test circuit in accordance with the invention. The test circuit includes a scan chain 20 comprised of a sequence of serially connected Y scan flip-flops S(1) through S(Y), each flip-flop having a D input and a Q output. In accordance with conventional scan path testing techniques, the Q outputs of the first through $(Y-1)^{th}$ scan flip-flop are respectively connected the inputs of the second through $Y^{th}$ scan flip-flop. The scan flip-flops are clocked by a system clock signal SYSCLK.

The output of the $Y^{th}$ scan flip-flop S(Y) is connected to a 0 input of a 2-to-1 multiplexer 17 which has its 1 input connected to an output of a test controller 19 that provides Scan In data to the multiplexer 17. The test controller 19 comprises, for example, a test controller that is contained in the digital integrated circuit device in which the test circuit of FIG. 1 is implemented, or it can comprise automatic test equipment (ATE) that is external to the test circuit. The Scan In signal provided by the test controller is clocked or synchronized by a test clock signal TSTCLK which is synchronous with the system clock signal SYSCLK. The test clock signal TSTCLK more particularly has a frequency that is lower than the frequency of the system clock signal SYSCLK, and the ratio of the test clock signal period to the system clock signal period is a fixed integer M.

The output of the multiplexer 17 is connected to the D input of the first scan flip-flop S(1), and the control input of the multiplexer 17 is connected to the output of a two input AND gate 21. One of the inputs of the AND gate 21 is connected to an output of a test synch generator 23 and receives a TEST SYNCH signal from the test synch generator 23 which generates the TEST SYNCH signal in response to the system clock signal SYSCLK and a test clock signal TSTCLK. The other input of the AND gate 21 receives a recirculate signal RECIRC.

The output of the multiplexer 17 comprises a replica of the signal at its 0 input when the input to its control input is a logical 0, and is a replica of the signal at its 1 input when the input to its control input is a logical 1. Thus, when the recirculate signal RECIRC is a logical 0, the input to the control input of the multiplexer 17 is always a logical 0 regardless of changes in the state of TEST SYNCH, and the output of multiplexer 17 is a replica of the output of the $Y^{th}$ scan flip-flop S(Y) so long as the recirculate signal RECIRC is a logical 0. When the recirculate signal RECIRC is a logical 1, the output of the AND gate is a replica of the TEST SYNCH signal, and thus the operation of the multiplexer is controlled by the TEST SYNCH signal when the recirculate signal RECIRC is a logical 1. In particular, when the recirculate signal RECIRC is a logical 1, the output of the multiplexer 17 comprises a replica of the signal at its 0 input when the TEST SYNCH signal is a logical 0, and is a replica of the signal at its 1 input when the TEST SYNCH signal is a logical 1. In accordance with conventional logic circuit protocol, a logical 0 is represented by a first voltage while a logical 1 is represented by a voltage that is greater than 0. For ease of reference, a logic signal is commonly referred to as being low when it represents a logical 0, and high when it represents a logical 1.

The output of the $Y^{th}$ scan flip-flop S(Y) is further connected to the D input of an output flip-flop 25 which is not a scan flip-flop. The output flip-flop 25 is clocked by the system clock signal SYSCLK, and the load control input LD of the output flip-flop 25 receives the TEST SYNCH signal provided by the test synch generator 23. When the TEST SYNCH signal is a logical 0, the output flip-flop 25 is disabled; and when the TEST synch signal is a logical 1, the output flip-flop 25 is enabled.

The TEST SYNCH signal is a periodic signal having the same periodicity as the test clock signal TSTCLK, but is high for a time period that spans an active transition of the system clock signal SYSCLK so as to allow a Scan In data bit to be received by the first scan flip-flop S(1), when the recirculate signal RECIRC is high, and to allow the output flip-flop 25 to receive the output of the $Y^{th}$ scan flip-flop S(Y) pursuant to the same active system clock transition by which a Scan In data bit is received by the first scan flip-flop S(1). In particular, TEST SYNCH must be high for a sufficient time period to allow for set up time and hold time at the inputs to the first scan flip-flop S(1) and the output flip-flop 25 subsequent to the Scan In data becoming valid pursuant to an active edge of the test clock signal TSTCLK.

Figure 2:
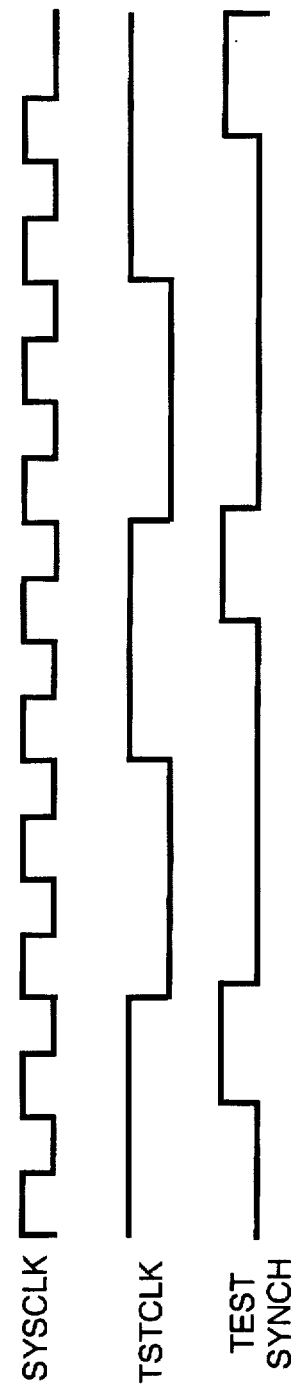
FIG. 2 schematically depicts the waveforms of timing signals utilized in the test circuit of FIG. 1.
Figure 3:
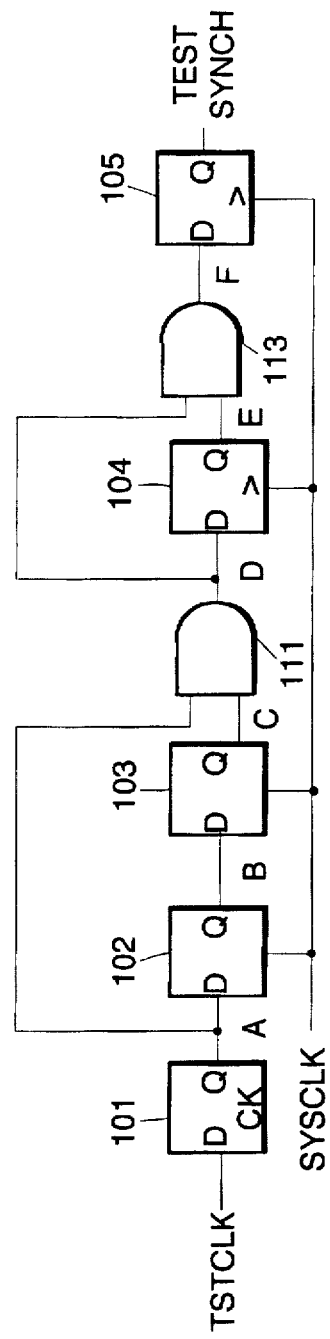
FIG. 3 is a schematic block diagram of a circuit for generating one of the timing signals depicted in FIG. 2.

FIG. 2 is a timing diagram that depicts a system clock signal SYSCLK, a test clock signal TSTCLK, and a TEST SYNCH signal for an illustrative example wherein the rising edges are active clock transitions and the test clock period to system clock period ratio is 4. As shown, TEST SYNCH is high for respective intervals each spanning a SYSCLK active transition that occurs at a falling edge of TSTCLK. FIG. 3 sets forth a schematic diagram of a synch generator for producing the TEST SYNCH signal of FIG. 2. The synch generator of FIG. 3 includes a flip-flop 101 which receives the test clock signal TSTCLK at its D input and receives the system clock signal SYSCLK at its negated clock input. The Q output of the flip-flop 101 is connected to the D-input of a flip-flop 102 which receives the system clock signal SYSCLK at its clock input. The Q output of the flip-flop 102 is connected to the D-input of a flip-flop 103 which receives the system clock signal SYSCLK at its clock input. The Q output of the flip-flop 103 is connected to one input of a two-input AND gate 111 which has its other input connected to the Q output of the flip-flop 101. The output of the AND gate 111 is connected to the D-input of a flip-flop 104 which receives the system clock signal SYSCLK at its negated clock input. The Q output of the flip-flop 104 is connected to one input of a two-input OR gate 113 which has its other input connected to the output of the AND gate 111. The output of the of the OR gate 113 is connected to the D input of a flip-flop 105 which receives the system clock signal SYSCLK at its clock input. The Q output of the flip-flop 105 provides the TEST SYNCH signal.

Referring again to FIG. 1, the number Y of scan flip-flops S(1) through S(Y) is selected as follows:

$$Y = N*M + 1$$

wherein N is an integer and M is the integer ratio of test clock period to system clock period.

Data is scanned into and out of the scan flip-flops as follows. Since the ratio of test clock period to system clock period is M, on every $M^{th}$ system clock a data bit can be scanned into the first scan flip-flop S(1) and an output bit can be scanned from the output flip-flop 25. Thus, Y data bits destined for the scan flip-flops can be scanned into the first scan flip-flop S(1) pursuant to Y test clock periods, and Y data bits from the scan flip-flops can be scanned out of the output flip-flop 25 pursuant to Y test clock periods.

In view of the fact that a data bit is scanned out of the output flip-flop 25 only every $M^{th}$ system clock period, data bits are not scanned out in the sequence in which they are contained in the scan flip-flops. If the data bits to be shifted out of the scan flip-flops S(1) through S(Y) are identified by the numbers 1 through Y, for the particular example wherein the last scan flip-flop S(Y) contains Bit 1 and the first scan flip-flop S(1) contains Bit 2 at the time of the positive transition of the first TEST SYNCH pulse, the bit number of the data bit outputted by the output flip-flop 25 during each of Y test clock cycles numbered 1 through Y is:

$$\text{Bit Number Out} = \{[Y-((TCYCLE-1)*M)] \text{ modulo } Y\} + 1$$

wherein TCYCLE is the number of the particular test clock cycle and M is the test clock period to system clock period ratio. For the particular example of a 9 bit scan chain (i.e., Y is equal to 9) and a 4 to 1 test clock period to system clock period ratio, the bits numbered 1 through 9 are shifted out in the following sequence: 1, 6, 2, 7, 3, 8, 4, 9, 5.

In view of the fact that a data bit can be scanned into the first scan flip-flop S(1) only every $M^{th}$ system clock period, the data bits for the respective scan flip-flops must be input in a sequence that is different from the sequence of the scan flip-flops. If the data bits to be respectively shifted into the scan flip-flops S(1) through S(Y) are identified with the numbers 1 through Y, for the particular example wherein the last scan flip-flop S(Y) contains Bit 1 and the first scan flip-flop S(1) contains Bit 2 at the time of the positive transition of the first TEST SYNCH pulse the bit number of the input bit scanned into the first flip-flop S(1) during each of Y test clock cycles numbered 1 through Y is:

$$\text{Bit Number In} = \{[Y-((TCYCLE-1)*M)] \text{modulo } Y\} + 1$$

wherein TCYCLE is the number of the particular test clock cycle and M is the test clock period to system clock period ratio. For the particular example of a 9 bit scan chain (i.e., Y is equal to 9) and a 4 to 1 test clock period to system clock period ratio, the bits numbered 1 through 9 for the respective scan flip-flops S(1) through S(9) are shifted into the first scan flip-flop S(1) in the following sequence: 1, 6, 2, 7, 3, 8, 4, 9, 5.

Effectively, the contents of the scan flip-flops are recirculated at the system clock frequency, and on each cycle of the test clock a new bit is introduced and a bit is read out or extracted, such that all the data bits in the scan chain are addressed. In other words, while the contents of the scan flip-flops are recirculated, data is scanned in and scanned out synchronously with the test clock signal.

Figure 4:
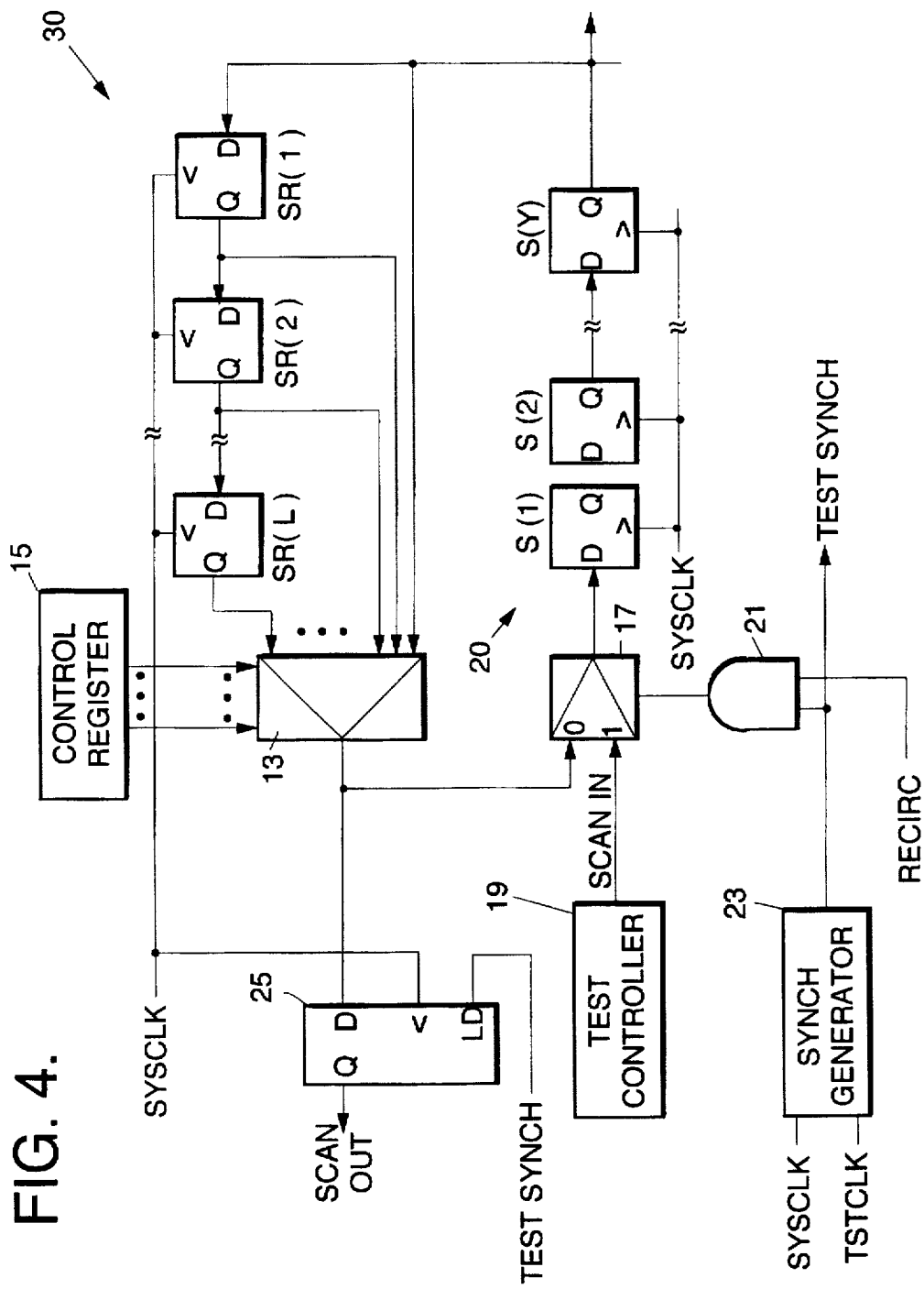
FIG. 4 is a schematic block diagram of a further embodiment of a test circuit in accordance with the invention

Referring now to FIG. 4, set forth therein is a schematic block diagram of an implementation of the invention that is suitable for those applications wherein the ratio of test clock period to system clock period is variable and/or the length Y of the scan chain 20 cannot be adjusted. The test circuit of FIG. 4 includes components that are similar to the components of the test circuit of FIG. 1, together with additional components that provide for a variable effective scan chain length. More particularly, the output of the $Y^{th}$ scan flip-flop S(Y) is connected to the input of the first register SR(1) of an L-stage serial to parallel shift register 30 that includes L serially connected registers SR(1) through SR(L) which are clocked by the system clock signal SYSCLK. The Q output of the $Y^{th}$ scan flip-flop S(Y) and the outputs of the respective registers SR(1) through SR(L) are connected in parallel to the data inputs of an (L+1)-to-1 multiplexer 13 having its control inputs connected to the outputs of a control register 15. In accordance with conventional multiplexer operation, the output of the multiplexer 13 is replica of the data input that is selected by the output of the control register 15. The output of the multiplexer 13 is connected to the 0 input of the 2-to-1 multiplexer 17, and is further connected to the D input of an output flip-flop 25 which is not a scan flip-flop. The output flip-flop 25 is clocked by the system clock signal SYSCLK, and the load control input LD of the output flip-flop 25 receives the TEST SYNCH signal provided by the test synch generator 23. When the TEST SYNCH signal is a logical 0, the output flip-flop 25 is disabled; and when the TEST synch signal is a logical 1, the output flip-flop 25 is enabled.

The serial to parallel shift register 30 comprises a dummy register whose length is controlled by the operation of the (L+1)-to-1 multiplexer 13 and the control register 15, and thus functions as a variable extension of D stages to the scan chain 20, wherein the extension can range from 0 to L stages, and wherein the extension of D stages comprises the first D stages SR(1) through SR(D). The effective scan chain length Z of the chain comprised of the scan chain 20 and the extension of D stages of the serial to parallel shift register 11 is:

$$Z=Y+D$$

wherein Y is the number of scan flip-flops in the scan chain 20. The effective scan chain length Z is particularly selected to satisfy the following condition:

$$Z=N*M+1$$

wherein N is any integer and M is the integer ratio of test clock period to system clock period. This condition is particularly satisfied by selecting the extension of D stages as follows:

$$D=(M-Y+1) \bmod M$$

Data is scanned into and out of the scan flip-flops as follows. Since the ratio of test clock period to system clock period is an integer M, on every $M^{th}$ system clock a data bit can be scanned into the first scan flip-flop S(1) and a data bit can be scanned out of the output flip-flop 25. Thus, Z data bits destined for the scan flip-flops and the extension of D stages of the serial to parallel register 30 can be scanned into the first scan flip-flop S(1) pursuant to Z test clock periods, and Z data bits from the scan flip-flops and the D stages can be scanned out of the output flip-flop 25 pursuant to such Z test clock periods. However, the data bits for the scan chain will be interleaved with data bits that will be in the D stages SR(1) through SR(D) of the serial to parallel shift register when the data bits for the scan flip-flops are in their destination locations, and thus input data bits destined for the D stages SR(1) through SR(D) of the serial to parallel shift register can be arbitrary. Similarly, the data bits scanned out of the output flip-flop 25 will include data bits "scanned" out of the scan flip-flops interleaved with bits from the D stages SR(1) through SR(D) of the serial to parallel shift register, and the bits "scanned" out of the D stages SR(1) through SR(D) of the serial to parallel shift register can be ignored.

In view of the fact that a data bit is scanned out of the output flip-flop 25 only every $M^{th}$ system clock period, the data bits of the scan flip-flops are not scanned out in the sequence in which they are contained in the scan flip-flops. If the data bits to be scanned output of the scan flip-flops S(1) through S(Y) are identified by the numbers 1 through Y and the data bits in the D stages SR(1) through SR(D) of the serial to parallel shift register are identified by the numbers Y+1 through Y+D, wherein Y+D is equal to Z, for the particular example wherein the stage SR(D) contains Bit 1 and the first scan flip-flop S(1) contains Bit 2 at the time of the positive transition of the first TEST SYNCH pulse, the bit number of the data bit scanned out of the output flip-flop 25 during each of Z test clock cycles numbered 1 through Z is:

$$\text{Bit Number Out}=\{[Z-((TCYCLE-1)*M)] \bmod Z\}+1$$

wherein TCYCLE is the number of the particular test clock cycle and M is the test clock period to system clock period ratio. The data bits Y+1 through Y+D can be ignored since these are the bits that were in the D stages SR(1) through SR(D) of the serial to parallel shift register at the start of the scan out process. For the particular example of a 9 bit effective scan chain length (i.e., Z is equal to 9) and a 4 to 1 test clock period to system clock period ratio, the bits numbered 1 through 9 are shifted out in the following sequence: 1, 6, 2, 7, 3, 8, 4, 9, 5. If the number Y of scan flip-flops is 7, whereby D is 2, for example, then output bits numbered 8 and 9 would be ignored.

In view of the fact that a data bit is scanned into the first scan flip-flop S(1) only every $M^{th}$ system clock period, the data bits for the respective scan flip-flops must be input in a sequence that is different from the sequence of the scan flip-flops. If the data bits to be respectively shifted into the scan chain 20 are identified with the number 1 through Y and the data bits to be shifted into the D stages SR(1) through SR(D) of the serial to parallel shift register are identified by the numbers Y+1 through Y+D, wherein Y+D is equal to Z, for the particular example wherein the stage SR(D) contains Bit 1 and the first scan flip-flop S(1) contains Bit 2 at the time of the positive transition of the first TEST SYNCH pulse, the bit number of the data bit that is scanned into the first flip-flop S(1) during each of Z test clock cycles numbered 1 through Z is:

$$\text{Bit Number In}=\{[Z-((TCYCLE-1),M)] \bmod Z\}+1$$

wherein TCYCLE is the number of the particular test clock cycle and M is the test clock period to system clock period ratio. For the particular example of a 9 bit scan chain (i.e., Z is equal to 9) and a 4 to 1 test clock period to system clock period ratio, the bits numbered 1 through 9 for the scan flip-flops S(1) through S(Y) and the D stages SR(1) through SR(D) are shifted into the first scan flip-flop S(1) in the following sequence: 1, 6, 2, 7, 3, 8, 4, 9, 5. If Y is 7, whereby D is 2, for example, then the data bits numbered 8 and 9 can be arbitrary.

The foregoing has been a disclosure of boundary scan test circuits that accommodate a test clock frequency that is different from a system clock frequency without disturbing the clock distribution system of the digital device in which it is implemented, and which can be economically and efficiently implemented.

Although the foregoing has been a description and illustration of specific embodiments of the invention, various modifications and changes thereto can be made by persons skilled in the art without departing from the scope and spirit of the invention as defined by the following claims.

What is claimed is:

1. A test circuit comprising:

Y scan flip-flops each having an input and an output, said Y scan flip-flops being connected serially in a sequence from a first scan flip-flop to an $Y^{th}$ scan flip-flop whereby the output of each of the first through $(Y-1)^{th}$ flip-flops is connected to the input of a scan flip-flop that is immediately next in sequence, said Y scan flip-flops being clocked by a system clock signal;

feedback means connected between the output of the $Y^{th}$ scan flip-flop and the input of the first scan flip-flop for recirculating data in the scan flip-flops at the frequency of the system clock signal and for providing input data to the first scan flip-flop at the frequency of a test clock signal, wherein the ratio of the period of the test clock to the period of the system clock is equal to an integer M, said feedback means comprising:

synchronizing means responsive to the system clock signal and the test clock signal for generating a synchronizing signal that is in a first logical state during every $M^{th}$ active transition of the system clock signal and in a second logical state between occurrences of said first logical state;

serial-to-parallel shift register means having L registers each having an input and an output, said L registers being connected serially in a sequence from a first register to an $L^{th}$ register whereby the output of each of the first through $(L-1)^{th}$ register is connected to the input of a register that is immediately next in sequence, said L registers being clocked by the system clock signal;

first selection means having inputs connected to the outputs of said serial-to-parallel shift register and the output of said $Y^{th}$ scan flip-flop for providing an output that is a replica of a selected one of said inputs;

control means connected to said first selection means for providing control signals to select said selected one of said inputs, wherein a length of said shift register means is programmably set by said control means to thereby provide a variable extension of said sequence of scan flip-flops;

second selection means having a first input connected to the output of said first selection means, a second input for receiving scan input data, and an output connected to the input of said first scan flip-flop, said selection means responsive to said synchronizing signal for providing a selection means output that comprises (a) a replica of the scan input when said synchronizing signal is in said first logical state, and (b) a replica of the output of said first selection means when said synchronizing signal is in said second logical state; and an output flip-flop clocked by the system clock and having an input connected to the output of said first selection means, said output flip-flop being periodically enabled pursuant to said test clock signal when said synchronization signal is in its first logical state.

* * * * *